(12) United States Patent
Nishida

(10) Patent No.: US 7,624,292 B2
(45) Date of Patent: Nov. 24, 2009

(54) BATTERY POWER DETECTION DEVICE

(75) Inventor: Junji Nishida, Osaka (JP)

(73) Assignee: Ricoh Company, Ltd., Tokyo (JP)

( * ) Notice: Subject to any disclaimer, the term of this patent is extended or adjusted under 35 U.S.C. 154(b) by 575 days.

(21) Appl. No.: 11/274,267

(22) Filed: Nov. 16, 2005

(65) Prior Publication Data
US 2006/0117194 A1   Jun. 1, 2006

(30) Foreign Application Priority Data
Nov. 17, 2004   (JP) .............................. 2004-333283

(51) Int. Cl.
*G06F 1/28* (2006.01)
(52) U.S. Cl. ...................... 713/340; 713/310; 320/134; 320/136; 324/432; 324/433
(58) Field of Classification Search ................. 713/300, 713/340, 310; 320/134, 136; 324/432, 433
See application file for complete search history.

(56) References Cited

U.S. PATENT DOCUMENTS

| | | | | |
|---|---|---|---|---|
| 6,437,540 | B2 * | 8/2002 | Sonobe ........................ | 320/134 |
| 6,515,452 | B2 * | 2/2003 | Choo ........................... | 320/132 |
| 7,109,875 | B2 * | 9/2006 | Ota et al. ..................... | 340/635 |
| 2005/0046389 | A1 * | 3/2005 | Kim ............................ | 320/132 |

FOREIGN PATENT DOCUMENTS

| | | |
|---|---|---|
| JP | 11-162524 A | 6/1999 |
| JP | 3087276 B2 | 7/2000 |

* cited by examiner

*Primary Examiner*—Thuan N Du
(74) *Attorney, Agent, or Firm*—Dickstein Shapiro LLP

(57) ABSTRACT

A battery power detection device is disclosed that has a reduced circuit area and is able to achieve sufficiently high detection accuracy. The battery power detection device includes a temperature section detection unit that detects a temperature of the battery and detects one of plural predetermined temperature sections including the detected temperature, a current section detection unit that detects a current output from the battery and detects one of plural predetermined current sections including the detected current; and a power section detection unit that has plural voltage-power data tables including data indicating the relation between the voltage output from the battery and the remaining power sections of the battery. The power section detection unit selects one of the voltage-power data tables according to the detected temperature section and the detected current section, and detects one of the remaining power sections associated with a given voltage of the battery.

29 Claims, 8 Drawing Sheets

FIG.4

| Section | 1st section | 2nd section | 3rd section | 4th section | 5th section | 6th section | 7th section | 8th section | 9th section | 10th section |
|---|---|---|---|---|---|---|---|---|---|---|
| Temperature | −20°C ~ −10°C | −10°C ~ 0°C | 0°C ~ 10°C | 10°C ~ 20°C | 20°C ~ 30°C | 30°C ~ 40°C | 40°C ~ 50°C | 50°C ~ 60°C | 60°C ~ 70°C | |

FIG.5

| Section | 1st section | 2nd section | 3rd section | 4th section | 5th section | 6th section | 7th section | 8th section | 9th section | 10th section |
|---|---|---|---|---|---|---|---|---|---|---|
| Current | 20mA ~ 40mA | 40mA ~ 60mA | 60mA ~ 80mA | 80mA ~ 100mA | 100mA ~ 120mA | 120mA ~ 140mA | 140mA ~ 160mA | 160mA ~ 180mA | 180mA ~ 200mA | |

BATTERY POWER DETECTION DEVICE

BACKGROUND OF THE INVENTION

1. Field of the Invention

The present invention relates to a battery power detection device, and in particular, to a battery power detection device for detecting remaining power of a secondary battery used in a mobile phone or other portable apparatuses.

2. Description of the Related Art

In a portable apparatus using a secondary battery as a power supply, such as a mobile phone and a notebook personal computer, usually, a battery power detection device is installed to detect the remaining power (stored energy) of the secondary battery (below, just abbreviated to be "battery power" or "power of battery" where necessary). For example, the detected remaining power of the secondary battery can be presented on a display to notify the user of the time to charge the battery.

In the related art, for example, a battery power detection device detects the battery power by means of current integration or voltage measurement. In the method of current integration, the current supplied to a load from the battery in use is integrated throughout the usage duration, and from the integration result, the used power (expended energy) of the battery is calculated, and the remaining power is obtained by subtracting the used power from the total power (starting power). With this method, the power of the battery can be calculated accurately, however, such a battery power detection device is expensive, and since current integration has to be carried out over all the time when the battery discharges, the power consumed by the battery power detection device is not negligible.

In the method of voltage measurement, the output voltage of the battery is measured with the battery being connected to with a specified load, and the power of the battery is predicted from the measured voltage. With this method, the battery power detection device is operated only when it is necessary to detect the power of the battery; hence, the power consumed by the battery power detection device is low, and the battery power detection device is inexpensive. However, the detection accuracy is low compared to the current integration method.

The method of voltage measurement utilizes the characteristic that the output voltage of the battery decreases along with the decrease of battery power. Since the relationship between the output voltage of the battery and the battery power varies along with the temperature of the battery and the load current of the battery, it is not guaranteed that the battery power can be accurately predicted from the measured output voltage of the battery. In the battery power detection device of the related art which uses the method of voltage measurement, in order to improve the measurement accuracy, the temperature and the load current of the battery are also measured during battery power detection, and the power of the battery is predicted from the measured voltage, temperature, and the load current of the battery.

For example, Japanese Patent Gazette No. 3087276 discloses a battery power detection device in which plural data tables are installed to define the battery voltages of stepwise levels corresponding to different discharging currents of the battery in different temperature sections. This battery power detection device includes a data processing unit, a voltage input unit for inputting the battery voltages to the data processing unit, a current input unit for inputting the discharging currents of the battery to the data processing unit, a temperature input unit for inputting the battery temperatures to the data processing unit, and a display. The data processing unit generates and outputs a signal representing the stepwise level of the battery voltage indicating the battery power with the battery voltage being corrected with a discharging current by using one of the data tables. The display processes the signal output from the data processing unit and displays the signal in a stepwise manner.

In addition, for example, Japanese Laid-Open Patent Application No. 11-162524 discloses a battery power detection device which includes a unit for determining the power of a battery based on output of a voltage sensor and a current sensor, and the power determined by the unit is corrected according to output of a temperature detector for detecting the temperature of the battery. In the unit for determining the battery power, there is stored a data table containing battery power data determined according to the relation between voltage and current of the battery. The unit determines the battery power from the output of the voltage sensor and the current sensor, and decides whether the determined battery power is greater than a specified reference value. In this process, the unit corrects the determined battery power using the temperature of the battery given by the temperature detector arranged near the battery.

However, in the battery power detection devices of the related art, which detect the battery power by voltage measurement, it is required to store a two-dimensional data table in order to determine the battery power based on the relation between the output voltage and the power of the battery, and in addition, in order to make temperature corrections, it is required to stores plural data tables. Due to this, in the battery power detection devices of the related art which detect the battery power by voltage measurement, it is required to install a memory having a sufficiently large capacity to store the data tables.

Even in the battery power detection devices of the related art which detect the battery power by current integration, a memory having a sufficiently large capacity is required in order to perform integration over a long duration.

Consequently, in each of the battery power detection devices of the related art, there exists a memory having a large capacity, which in turn results in a circuit of a large area.

SUMMARY OF THE INVENTION

It is a general object of the present invention to solve one or more problems of the related art.

A specific object of the present invention is to provide a battery power detection device having a reduced circuit area and able to achieve sufficient high detection accuracy.

According to an aspect of the present invention, there is provided a battery power detection device for detecting remaining power of a battery, comprising: a temperature section detection unit that detects a temperature of the battery and detects one of a plurality of predetermined temperature sections including the detected temperature; a current section detection unit that detects a current output from the battery and detects one of a plurality of predetermined current sections including the detected current; and a power section detection unit that has a plurality of voltage-power data tables each table including data indicating a relation between a voltage output from the battery and a plurality of predetermined remaining power sections of the battery, said power section detection unit selecting one of the voltage-power data tables according to the detected temperature section and the detected current section, and detecting, with the selected voltage-power data table, one of the remaining power sections associated with a predetermined voltage of the battery.

As a preferable embodiment, the battery power detection device further includes a charging number detection unit that detects the number of times of charging the battery, wherein the power section detection unit selects one of the voltage-power data tables according to the detected temperature section, the detected current section, and the detected number of times of charging.

As a preferable embodiment, the power section detection unit starts or stops operations in response to an external control signal input from outside, and controls operations of the temperature section detection unit and the current section detection unit.

As a preferable embodiment, the voltage-power data tables include data indicating limits of each of the remaining power sections and voltage values corresponding to said limits, said limits including at least one of an upper limit and a lower limit of each of the remaining power sections, the power section detection unit including: a reference voltage generator that has the plurality of voltage-power data tables, said reference voltage generator selecting one of the voltage-power data tables according to the detected temperature section and the detected current section, and sequentially outputting the voltage values corresponding to said limits indicated by the selected voltage-power data table as reference voltages; a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery.

As a preferable embodiment, the reference voltage generator includes: a storage unit that stores the voltage-power data tables; a selection unit that selects one of the voltage-power data tables according to the detected temperature section and the detected current section; and an output unit that sequentially outputs the voltage values corresponding to said limits indicated by the selected voltage-power data table as reference voltages.

As a preferable embodiment, the temperature section detection unit includes: a first temperature detector that detects the temperature of the battery, and outputs a temperature-related voltage proportional to the detected temperature; and a second temperature detector that has a temperature-voltage data table including data indicating a relation between the temperature of the battery and the temperature-related voltage, said second temperature detector detecting one of the temperature sections including the detected temperature with the temperature-voltage data table and the detected temperature-related voltage, and outputting the detected temperature section.

As a preferable embodiment, the temperature-voltage data table includes data indicating limits of each of the temperature sections and temperature-related voltage values corresponding to said limits, said limits including at least one of an upper limit and a lower limit of each of the temperature sections, the second temperature detector including: a reference temperature-related voltage generator that has the temperature-voltage data table, and outputs sequentially the temperature-related voltage values corresponding to said limits indicated by the temperature-voltage data table as reference temperature-related voltages; a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature.

As a preferable embodiment, the current section detection unit includes a first current detector that detects the current output from the battery, and outputs a current-related voltage proportional to the detected current; and a second current detector that has a current-voltage data table including data indicating a relation between the current output from the battery and the current-related voltage, the second current detector detecting one of the current sections including the detected current with the current-voltage data table and the detected current-related voltage, and outputting the detected current section.

As a preferable embodiment, the current-voltage data table includes data indicating limits of each of the current sections and current-related voltage values corresponding to said limits, said limits including at least one of an upper limit and a lower limit of each of the current sections, the second current detector including: a reference current-related voltage generator that has the current-voltage data table, and outputs sequentially the current-related voltage values corresponding to said limits indicated by the current-voltage data table as reference current-related voltages; a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current.

As a preferable embodiment, the voltage-power data tables include data indicating limits of each of the remaining power sections and voltage values corresponding to said limits, said limits including at least one of an upper limit and a lower limit of each of the remaining power sections, the power section detection unit including: a reference voltage generator that has the plurality of voltage-power data tables, said reference voltage generator selecting one of the voltage-power data tables according to the detected temperature section and the detected current section, and sequentially outputting the voltage values corresponding to said limits indicated by the selected voltage-power data table as reference voltages; a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery, the temperature section detection unit including: a first temperature detector that detects the temperature of the battery, and outputs a temperature-related voltage proportional to the detected temperature; and a second temperature detector that has a temperature-voltage data table including data indicating a relation between the temperature of the battery and the temperature-related voltage, said second temperature detector detecting one of the temperature sections including the detected temperature with the temperature-voltage data table and the detected temperature-related voltage, and outputting the detected temperature section, the temperature-voltage data table including data indicating limits of each of the temperature sections and temperature-related voltage values corresponding to said limits, said limits including at least one of an upper limit and a lower limit of each of the temperature sections, the second temperature detector including:

a reference temperature-related voltage generator that has the temperature-voltage data table, and outputs sequentially the temperature-related voltage values corresponding to said limits indicated by the temperature-voltage data table as reference temperature-related voltages; a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature, the current section detection unit including: a first current detector that detects the current output from the battery, and outputs a current-related voltage proportional to the detected current; and a second current detector that has a current-voltage data table including data indicating a relation between the current output from the battery and the current-related voltage, said second current detector detecting one of the current sections including the detected current with the current-voltage data table and the detected current-related voltage, and outputting the detected current section, the current-voltage data table including data indicating limits of each of the current sections and current-related voltage values corresponding to said limits, said limits including at least one of an upper limit and a lower limit of each of the current sections, the second current detector including: a reference current-related voltage generator that has the current-voltage data table, and outputs sequentially the current-related voltage values corresponding to said limits indicated by the current-voltage data table as reference current-related voltages; a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current, wherein the reference voltage generator starts or stops operations in response to the external control signal, controls operations of the voltage comparator, and outputs a fourth control signal to the temperature section detection unit and a fifth control signal to the current section detection unit; the reference temperature-related voltage generator starts or stops operations in response to the fourth control signal, and controls operations of the temperature-related voltage comparator and the first temperature detector; and the reference current-related voltage generator starts or stops operations in response to the fifth control signal, and controls operations of the current-related voltage comparator and the first current detector.

As a preferable embodiment, the power section detection unit starts or stops operations in response to an external control signal input from outside, and controls operations of the temperature section detection unit, the current section detection unit, and the charging number detection unit.

As a preferable embodiment, the voltage-power data tables include data indicating limits of each of the remaining power sections and voltage values corresponding to said limits, said limits including at least one of an upper limit and a lower limit of each of the remaining power sections, the power section detection unit including: a reference voltage generator that has the plurality of voltage-power data tables, said reference voltage generator selecting one of the voltage-power data tables according to the detected temperature section, the detected current section, and the detected number of times of charging, and sequentially outputting the voltage values corresponding to said limits indicated by the selected voltage-power data table as reference voltages; a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery.

As a preferable embodiment, the reference voltage generator includes a storage unit that stores the voltage-power data tables; a selection unit that selects one of the voltage-power data tables according to the detected temperature section and the detected current section; and an output unit that sequentially outputs the voltage values corresponding to said limits indicated by the selected voltage-power data table as reference voltages.

As a preferable embodiment, the temperature section detection unit includes: a first temperature detector that detects the temperature of the battery and outputs a temperature-related voltage proportional to the detected temperature; and a second temperature detector that has a temperature-voltage data table including data indicating a relation between the temperature of the battery and the temperature-related voltage, said second temperature detector detecting one of the temperature sections including the detected temperature with the temperature-voltage data table and the detected temperature-related voltage, and outputting the detected temperature section.

As a preferable embodiment, the temperature-voltage data table includes data indicating limits of each of the temperature sections and temperature-related voltage values corresponding to said limits, said limits including at least one of an upper limit and a lower limit of each of the temperature sections, the second temperature detector including: a reference temperature-related voltage generator that has the temperature-voltage data table, and outputs sequentially the temperature-related voltage values corresponding to said limits indicated by the temperature-voltage data table as reference temperature-related voltages; a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature.

As a preferable embodiment, the current section detection unit includes: a first current detector that detects the current output from the battery, and outputs a current-related voltage proportional to the detected current; and a second current detector that has a current-voltage data table including data indicating a relation between the current output from the battery and the current-related voltage, said second current detector detecting one of the current sections including the detected current with the current-voltage data table and the detected current-related voltage, and outputting the detected current section.

As a preferable embodiment, the current-voltage data table includes data indicating limits of each of the current sections and current-related voltage values corresponding to said limits, said limits including at least one of an upper limit and a lower limit of each of the current sections, the second current detector including: a reference current-related voltage generator that has the current-voltage data table, and outputs sequentially the current-related voltage values corresponding to said limits indicated by the current-voltage data table as reference current-related voltages; a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current.

As a preferable embodiment, the voltage-power data tables include data indicating limits of each of the remaining power sections and voltage values corresponding to said limits, said limits including at least one of an upper limit and a lower limit of each of the remaining power sections, the power section detection unit including: a reference voltage generator that has the plural voltage-power data tables, said reference voltage generator selecting one of the voltage-power data tables according to the detected temperature section, the detected current section, and the detected number of times of charging, and sequentially outputting the voltage values corresponding to said limits indicated by the selected voltage-power data table as reference voltages; a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery, the temperature section detection unit including: a first temperature detector that detects the temperature of the battery, and outputs a temperature-related voltage proportional to the detected temperature; and a second temperature detector that has a temperature-voltage data table including data indicating a relation between the temperature of the battery and the temperature-related voltage, said second temperature detector detecting one of the temperature sections including the detected temperature with the temperature-voltage data table and the detected temperature-related voltage, and outputting the detected temperature section, wherein the temperature-voltage data table includes data indicating limits of each of the temperature sections and temperature-related voltage values corresponding to said limits, said limits including at least one of an upper limit and a lower limit of each of the temperature sections, and the second temperature detector includes: a reference temperature-related voltage generator that has the temperature-voltage data table, and outputs sequentially the temperature-related voltage values corresponding to said limits indicated by the temperature-voltage data table as reference temperature-related voltages; a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature, the current section detection unit including: a first current detector that detects the current output from the battery, and outputs a current-related voltage proportional to the detected current; and a second current detector that has a current-voltage data table including data indicating a relation between the current output from the battery and the current-related voltage, said second current detector detecting one of the current sections including the detected current with the current-voltage data table and the detected current-related voltage, and outputting the detected current section, the current-voltage data table including data indicating limits of each of the current sections and current-related voltage values corresponding to said limits, said limits including at least one of an upper limit and a lower limit of each of the current sections, the second current detector including: a reference current-related voltage generator that has the current-voltage data table, and outputs sequentially the current-related voltage values corresponding to said limits indicated by the current-voltage data table as reference current-related voltages; a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current, wherein the reference voltage generator starts or stops operations in response to the external control signal, controls operations of the voltage comparator, and outputs a fourth control signal to the temperature section detection unit, a fifth control signal to the current section detection unit, and a sixth control signal to the charging number detection unit; the reference temperature-related voltage generator starts or stops operations in response to the fourth control signal, and controls operations of the temperature-related voltage comparator and the first temperature detector; and the reference current-related voltage generator starts or stops operations in response to the fifth control signal, and controls operations of the current-related voltage comparator and the first current detector.

As a preferable embodiment, the battery power detection device further comprises: a charging-discharging detection unit that detects whether the battery is being charged or being discharged, and outputs a seventh control signal corresponding to a detection result; a power storage unit that receives the remaining power section detected by the power section detection unit and the seventh control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section, wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the battery power detection device further comprises: a charging-discharging detection unit that detects whether the battery is being charged or being discharged, and outputs an eighth control signal corresponding to a detection result; a power storage unit that receives the remaining power section detected by the power section detection unit and the eighth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section, wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the power section detection unit controls operations of the charging-discharging detection unit and the power section output unit in response to the external control signal.

As a preferable embodiment, the charging number detection unit detects whether the battery is being charged or being discharged, and outputs a ninth control signal corresponding to a detection result, wherein the battery power detection device further comprises a power storage unit that receives the remaining power section detected by the power section detection unit and the ninth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section, wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the charging number detection unit detects whether the battery is being charged or being discharged, and outputs a 10th control signal corresponding to a detection result, wherein the battery power detection device further comprises a power storage unit that receives the remaining power section detected by the power section detection unit and the 10th control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section. When the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the power section detection unit controls operations of the power section output unit in response to the external control signal.

As a preferable embodiment, the charging number detection unit includes: a current detector that detects the current output from the battery, and outputs a current-related voltage proportional to the detected current; a charging comparator that compares the current-related voltage to a predetermined reference voltage, and outputs the ninth control signal when the reference voltage is higher than the current-related voltage; and a counter that counts a number of the ninth control signal output from the charging comparator, and outputs the count of the ninth control signal as the number of charging the battery.

As a preferable embodiment, the charging number detection unit includes: a current detector that detects the current output from the battery, and outputs a current-related voltage proportional to the detected current; a charging comparator that compares the current-related voltage to a predetermined reference voltage, and outputs the 10th control signal when the reference voltage is higher than the current-related voltage; and a counter that counts a number of the ninth control signal output from the charging comparator, and outputs the count of the ninth control signal as the number of charging the battery.

As a preferable embodiment, the battery power detection device further comprises a power storage unit that receives the remaining power section detected by the power section detection unit and the ninth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section, wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the battery power detection device further comprises a power storage unit that receives the remaining power section detected by the power section detection unit and the 10th control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section. When the remaining power sections are output from the power section detection unit, the power storage unit outputs the minimum power section including a minimum power among the remaining power sections output from the power section detection unit in a time period from a time when the battery starts to discharge to a time when the remaining power sections are output.

As a preferable embodiment, the power section detection unit controls operations of the power section output unit in response to the external control signal.

According to the present invention, the battery power detection device includes the temperature section detection unit that detects the temperature of the battery and determines which one of plural predetermined temperature sections includes the detected temperature, the current section detection unit that detects the current output from the battery and determines which one of plural predetermined current sections includes the detected current, and a power section detection unit that has plural voltage-power data tables each including data indicating a relationship between the voltage output from the battery and the remaining power section, the power section detection unit selecting one of the voltage-power data tables according to the determined temperature section and the determined current section, and determining, with the selected voltage-power data table, the remaining power section associated with a certain battery voltage. Due to such a configuration, it is not necessary to use a two-dimensional data table to determine the battery power based on the relationship between the output voltage and the power of the battery; in contrast, such a data table is required in the related art. Therefore, it is possible to reduce the capacity of the memory without reduction of detection accuracy of the battery power detection device, and thus, it is possible to reduce the circuit area of the battery power detection device.

These and other objects, features, and advantages of the present invention will become more apparent from the following detailed description of preferred embodiments given with reference to the accompanying drawings.

BRIEF DESCRIPTION OF THE DRAWINGS

FIG. 4 is a table exemplifying division of the operation temperature range of the battery into plural sections;

FIG. 5 is a table exemplifying division of the full range of the output current of the battery into plural sections;

DESCRIPTION OF THE PREFERRED EMBODIMENTS

Below, preferred embodiments of the present invention are explained with reference to the accompanying drawings.

First Embodiment

The battery power detection device according to a first embodiment of the present invention utilizes the characteristic that an output voltage of a battery decreases along with the decrease of remaining power of the battery, so that from a detected voltage of the battery, a remaining power section is determined which includes the present remaining power value of the battery.

Specifically, the full power range of the battery is divided into plural sections, voltage values corresponding to the limits of each of these sections are output sequentially as reference voltages, the detected battery voltage is compared to the reference voltages, and based on magnitude relationship between the detected battery voltage and the reference voltages, a remaining power section including the present remaining power value of the battery is determined. Below, the limiting power values of each of the battery power sections are simply referred to as "limit powers".

Since the relationship between the output voltage of the battery and the battery power value depends on the temperature of the battery and the output current of the battery, in the battery power detection device of the present embodiment, a temperature section including the present temperature of the battery and a current section including the present output current of the battery are determined, respectively, and reference voltages are generated corresponding to the determined temperature section and the determined current section.

In this way, even when the relationship between the output voltage of the battery and the battery power varies along with the temperature and the output current of the battery, it is possible to determine the remaining power of the battery correctly.

Below, the reference voltages are explained in detail.

Figure 1:
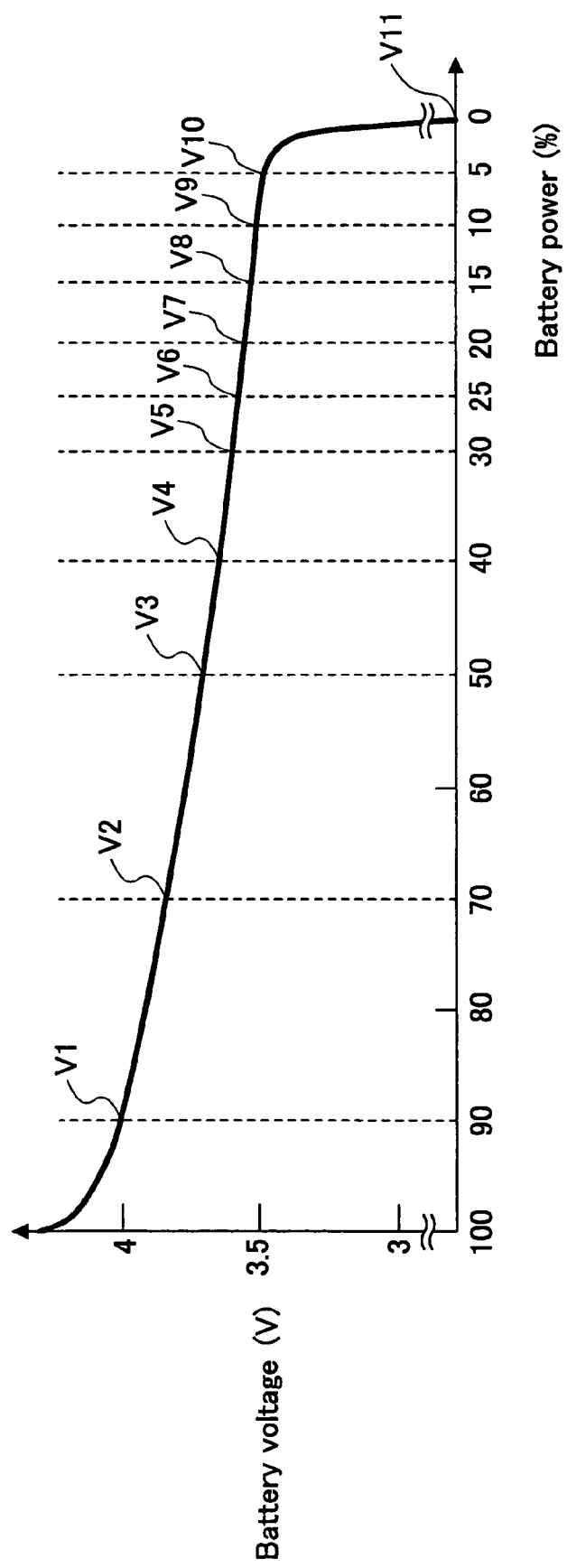
FIG. 1 is a graph exemplifying the relation between the output voltage of a battery and the power (stored energy) of the battery.

FIG. 1 is a graph exemplifying the relationship between the output voltage of a battery and the power of the battery.

As shown by the graph in FIG. 1, the output voltage of the battery decreases when the remaining power of the battery declines. By utilizing this relationship, for the same battery, from one quantity of the output voltage and the remaining power section, the other quantity can be determined. The so-called reference voltages are voltages corresponding to the limiting powers.

Figure 2:
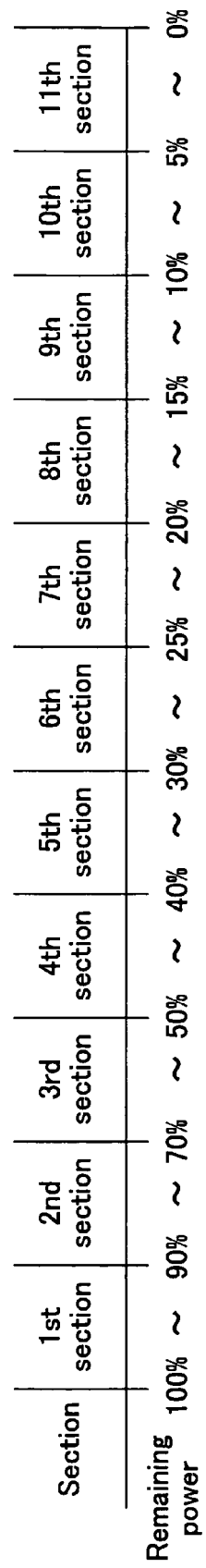
FIG. 2 is a table exemplifying division of the full power range of the battery into plural sections.

FIG. 2 is a table exemplifying division of the full power range of the battery into plural sections.

As illustrated in FIG. 2, the full power range (represented to be 0% to 100%) of the battery is divided into eleven sections, specifically, the first section corresponds to a range from 90% to 100% of the full power, the second section corresponds to a range from 70% to 90% of the full power, the third section corresponds to a range from 50% to 70% of the full battery power, the fourth section corresponds to a range from 40% to 50% of the full battery power, the fifth section corresponds to a range from 30% to 50% of the full battery power, the sixth section corresponds to a range from 25% to 30% of the full battery power, the seventh section corresponds to a range from 20% to 25% of the full battery power, the eighth section corresponds to a range from 15% to 20% of the full battery power, the ninth section corresponds to a range from 10% to 15% of the full battery power, the tenth section corresponds to a range from 5% to 10% of the full battery power, and the eleventh section corresponds to a range from 5% to 0% of the full battery power. The limit powers of these sections are defined to be the lower limits of these sections, that is, 90%, 70%, 50%, 40%, 30%, 25%, 20%, 15%, 10%, 5%, 0%, respectively.

According to FIG. 1, the voltages of the battery corresponding to the limit powers are V1 through V11. However, since the graph in FIG. 1, that is, the relationship between the output voltage of the battery and the battery power varies along with the temperature and the output current of the battery, if the limit powers V1 through V11 shown in FIG. 1 are directly used in any case, the present battery power value cannot be measured correctly. Thus, in the battery power detection device of the present embodiment, different reference voltages are generated according to a battery temperature section including the present temperature of the battery during measurement of the battery power and a current section including the present output current of the battery.

The battery output voltage at the same battery power level is high when the temperature of the battery is high, and the battery output voltage is low when the output current of the battery is small. In the battery power detection device of the present embodiment, the reference voltages generated by the battery power detection device are corrected in the following way. When the temperature of the battery is a certain value, and the output current of the battery is 0 A (that is, the load is zero), the battery voltages under this condition are regarded as standard voltages, and these standard voltages are corrected corresponding to the determined temperature section and the determined current section. Under these conditions, the reference voltages generated by the battery power detection device are corrected.

For example, when the temperature of the battery is 25° C., and the output current of the battery is 0 A, the corresponding battery voltage under this condition is regarded as a standard voltage. If the graph shown in FIG. 1 represents the relationship between the output voltage of the battery and the battery power when the temperature of the battery is 25° C., and the output current of the battery is 0 A, the standard voltages at those limit power are V1 through V11. Specifically, the standard voltage at the limit power 90% is V1, the standard voltage at the limit power 70% is V2, the standard voltage at the limit power 50% is V3, the standard voltage at the limit power 40% is V4, the standard voltage at the limit power 30% is V5, the standard voltage at the limit power 25% is V6, the standard voltage at the limit power 20% is V7, the standard voltage at the limit power 15% is V8, the standard voltage at the limit power 10% is V9, the standard voltage at the limit power 5% is V10, and the standard voltage at the limit power 0% is V11.

Assume n is an integer from 1 through 11, and the standard voltages at the limit power are represented to be Vn, and a voltage correction associated with the temperature of the battery is represented to be $\Delta Vnt$, then a voltage correction associated with the current of the battery is represented to be $\Delta Vni$, a comparison voltage Vnr can be expressed by the following formula (1).

$$Vnr = Vn + \Delta Vnt - \Delta Vni \quad (1)$$

In the battery power detection device of the present embodiment, since the full power range of the battery is divided into plural sections, the graph shown in FIG. 1 can be described by a linear equation in each of the sections. In each of the sections, the change of the battery voltage when the temperature of the battery changes by 1° C. is referred to as "temperature coefficient", and the change of the battery voltage when the output current of the battery changes by 1 A is equal to the internal resistance of the battery. Here, it is assumed that the temperature coefficient and the internal resistance of the battery are constant.

Hence, the voltage correction associated with the temperature of the battery $\Delta Vnt$ can be calculated by using an expression: $\Delta Vnt = \Delta T \times R$, where $\Delta T$ represents a difference between the temperature determined from the detected temperature section and a reference temperature, and R represents the temperature coefficient in the n-th power section. For example, the temperature determined from the detected temperature section equals the upper limit of the temperature of the detected temperature section.

The voltage correction associated with the current of the battery $\Delta Vni$ can be calculated as a product of the internal resistance in the n-th power section and the temperature determined from the detected temperature section. For example, the temperature determined from the detected temperature section equals the upper limit of the temperature of the detected temperature section.

As described above, in the battery power detection device of the present embodiment, since the full power range of the battery is divided into plural sections, in each of the sections, the relationship between the output voltage of the battery and the battery power level can be described by a linear equation, and the voltage of a section of the remaining power, which is corrected by using the temperature of the battery and the output current of the battery, can be obtained easily.

Figure 3:
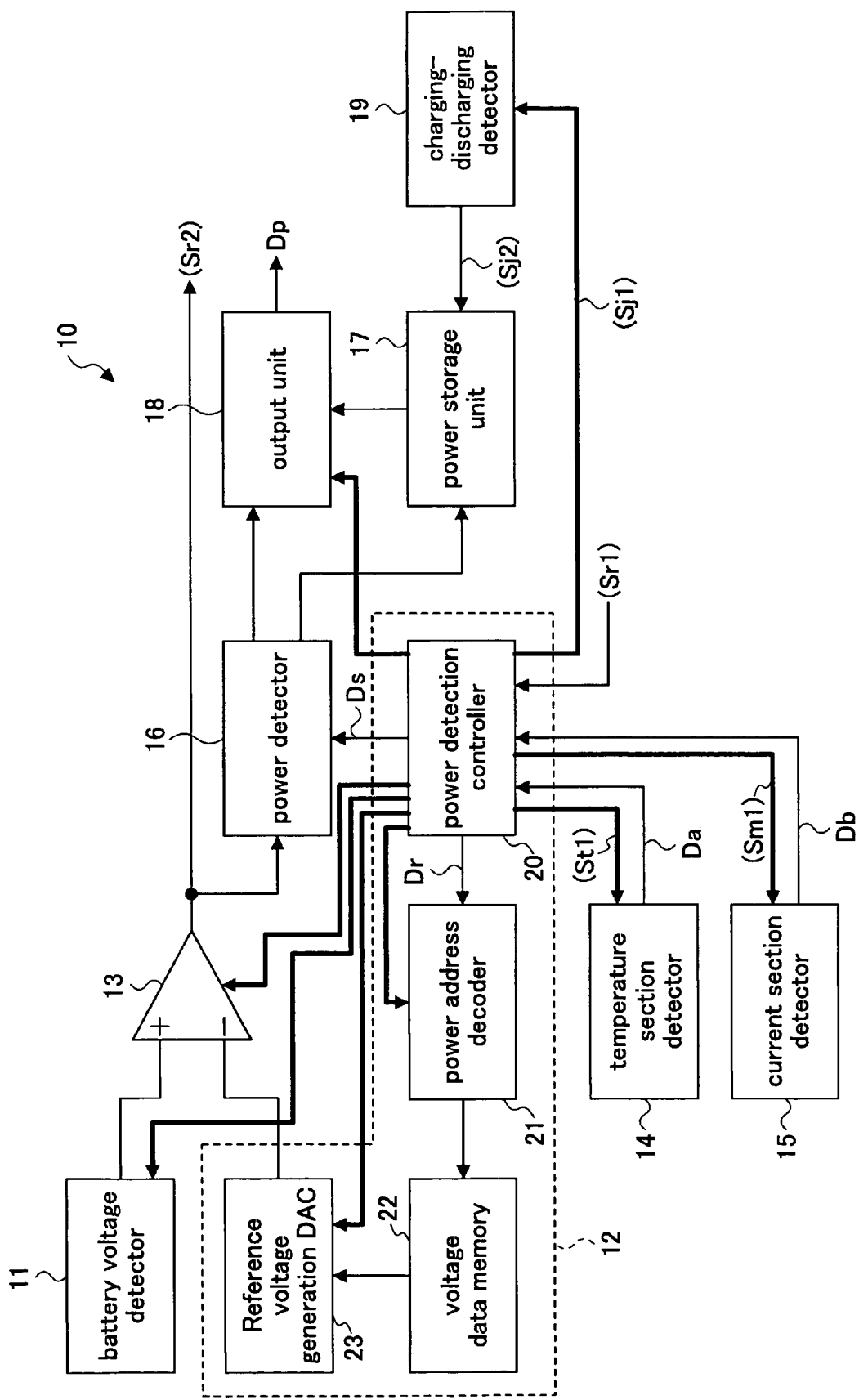
FIG. 3 is a block diagram exemplifying a configuration of a battery power detection device according to the present embodiment.

FIG. 3 is a block diagram exemplifying a configuration of a battery power detection device according to the present embodiment.

As illustrated in FIG. 3, a battery power detection device 10 includes a battery voltage detector 11, a reference voltage generation section 12, a voltage comparator 13, a temperature section detector 14, a current section detector 15, a power detector 16, a battery power storage unit 17, an output unit 18, and a charging-discharging detector 19.

The battery voltage detector 11 measures the output voltage of the battery and outputs the measured voltage value as the battery voltage data.

The reference voltage generation section 12 generates the above-described reference voltages. The reference voltage generation section 12 starts or stops operations in response to an external control signal Sr1 input from the outside of the battery power detection device 10.

The voltage comparator 13 is composed of an operational amplifier (Op-Amp); it compares the battery voltage output from the battery voltage detector 11 and the reference voltages generated by the reference voltage generation section 12, and generates a two-level control signal Sr2 in response to the magnitude relationship between the battery voltage and the reference voltages.

Here, the voltage comparator 13 corresponds to the voltage comparator in claims, and the reference voltage generation section 12, the voltage comparator 13, and the power detector 16 correspond to the power section detection unit in claims.

The temperature section detector 14 detects a battery temperature section including the temperature of the battery under power detection. This battery temperature section is one of plural temperature sections, which are divisions obtained by dividing the operating temperature range of the battery by a preset number.

FIG. 4 is a table exemplifying division of the operation temperature range of the battery into plural sections.

As illustrated in FIG. 4, the full range of the operating temperature of the battery (from –20° C. to 70° C.) is divided into plural sections with each section equaling 10° C., and thus obtaining totally 10 sections (the first section, the second section, ..., the 10th section). Specifically, the first temperature section corresponds to a temperature below –20° C. (in practice, a temperature of –20° C.), the second temperature section corresponds to a temperature range from –20° C. to –10° C., the third temperature section corresponds to a temperature range from –10° C. to 0° C., the fourth temperature section corresponds to a temperature range from 0° C. to 10° C., the fifth temperature section corresponds to a temperature range from 10° C. to 20° C., the sixth temperature section corresponds to a temperature range from 20° C. to 30° C., the seventh temperature section corresponds to a temperature range from 30° C. to 40° C., the eighth temperature section corresponds to a temperature range from 40° C. to 50° C., the ninth temperature section corresponds to a temperature range from 50° C. to 60° C., and the 10th temperature section corresponds to a temperature range from 60° C. to 70° C.

The temperature section detector 14 detects which of the above temperature sections includes the temperature of the battery under power detection, and outputs data Da representing this temperature section to the reference voltage generation section 12. The configuration and operations of the temperature section detector 14 are described below.

The current section detector 15 detects a current output from the battery under the power detection and detects one current section including the detected current. This current section is one of plural current sections, which are divisions obtained by dividing the full range of the output current of the battery by a preset number.

FIG. 5 is a table exemplifying division of the full range of the output current of the battery into plural sections.

As illustrated in FIG. 5, the full range of the output current of the battery (from 20 mA to 200 mA) of the battery is divided into plural sections with each section equaling 20 mA, and thus obtaining totally 10 sections (the first section, the second section, . . . , the 10th section). Specifically, the first current section corresponds to a current below 20 mA (in practice, a current of 20 mA), the second current section corresponds to a current range from 20 mA to 40 mA, the third current section corresponds to a current range from 40 mA to 60 mA, the fourth current section corresponds to a current range from 60 mA to 80 mA, the fifth current section corresponds to a current range from 80 mA to 100 mA, the sixth current section corresponds to a current range from 100 mA to 120 mA, the seventh current section corresponds to a current range from 120 mA to 140 mA, the eighth current section corresponds to a current range from 140 mA to 160 mA, the ninth current section corresponds to a current range from 160 mA to 180 mA, and the 10th current section corresponds to a current range from 180 mA to 200 mA.

The current section detector 15 detects which of the above current sections includes the output current of the battery under the power detection, and outputs data Db representing this current section to the reference voltage generation section 12. The configuration and operations of the current section detector 15 are described below.

As illustrated in FIG. 3, the reference voltage generation section 12 includes a power detection controller 20, a power address decoder 21, a voltage data memory 22, and a reference voltage generation DAC 23. In the voltage data memory 22, there are stored plural data tables each including data indicating reference voltages corresponding to the respective power sections for each combination of battery temperature section and battery current section.

As illustrated in FIG. 4 and FIG. 5, because there are ten battery temperature sections and ten battery current sections, 100 data tables are stored in the voltage data memory 22.

Here, the voltage data memory 22 corresponds to the "storage unit" in claims, the power detection controller 20 and the power address decoder 21 correspond to the "selection unit" in claims, and the reference voltage generation DAC 23 corresponds to the "output unit" in claims.

The two-level power control signal Sr1 from the outside of the battery power detection device 10 is input to the power detection controller 20. The power detection controller 20 starts or stops operations in response to the external control signal Sr1. Further, as illustrated in FIG. 3, in response to the level of the external control signal Sr1, the power detection controller 20 controls operations of the battery voltage detector 11, the voltage comparator 13, the temperature section detector 14, the current section detector 15, the output unit 18, the charging-discharging detector 19, the power address decoder 21, and the reference voltage generation DAC 23. For example, when the power control signal Sr1 is at a high level (denoted to be "H"), the power detection controller 20 starts operations, and when the two-level power control signal Sr1 is at a low level (denoted to be "L"), the power detection controller 20 stops operations. Specifically, when a high-level power control signal Sr1 is input to the power detection controller 20, the power detection controller 20 outputs corresponding control signals to the above components, such as the battery voltage detector 11, the voltage comparator 13, the temperature section detector 14, the current section detector 15, the output unit 18, the charging-discharging detector 19, the power address decoder 21, and the reference voltage generation DAC 23, and starts operations of these components. On the other hand, when a low-level power control signal Sr1 is input to the power detection controller 20, the power detection controller 20 outputs corresponding control signals to these components, and stops operations of these components.

The power detection controller 20 outputs control signals St1 and Sm1 to the temperature section detector 14 and the current section detector 15, respectively. The temperature section detector 14 starts or stops operations of temperature section detection in response to the level of the control signal St1; the current section detector 15 starts or stops operations of current section detection in response to the level of the control signal Sm1.

For example, assume when the control signal St1 and the control signal Sm1 are both at the high level, the temperature section detector 14 and the current section detector 15 start operations, and when the control signal St1 and the control signal Sm1 are both at the low level, the temperature section detector 14 and the current section detector 15 stop operations. Hence, when a high-level power control signal Sr1 is input to the power detection controller 20, the power detection controller 20 outputs high-level control signals St2, Sm2 to the temperature section detector 14 and the current section detector 15.

When receiving the high-level power control signal St2, the temperature section detector 14 starts detection operations, and outputs the temperature section data Da. When receiving the high-level power control signal Sm2, the current section detector 15 starts detection operations, and outputs the current section data Db.

For simplicity of description, in the following descriptions, it is assumed that the temperature section data Da indicates the seventh temperature section, and the current section data Db indicates the fourth current section.

The reference voltage generation section 12 generates the reference voltages in each of the power sections. Specifically, when the power control signal Sr1 input to the power detection controller 20 is at the high level, the power detection controller 20 outputs the data Dr to the power address decoder 21 in each of the power sections. Here, the data Dr include data representing the battery temperature section indicated by the temperature section data Da, which is detected by the temperature section detector 14, the battery current section indicated by the current section data Db, which is detected by the current section detector 15, and the battery power section.

For sake of convenience, integers p, q, n (p greater than or equal to 1, q less than or equal to 10, n greater than or equal to 1 and less than or equal to 11) are used as an index of the battery temperature section, an index of the battery current section, and an index of the battery power section, respectively; further, the data Dr is represented by a symbol (p, q, n) to point to a p-th battery temperature section, a q-th battery current section, and an n-th battery power section.

For example, the power detection controller 20 outputs data Dr of (7, 4, n), including (7, 4, 1) through (7, 4, 11), to the power address decoder 21. While the power detection controller 20 is outputting the data Dr of (7, 4, n), the power detection controller 20 also outputs data Ds indicating the n-th battery power section to the power detector 16.

Receiving the data Ds from the power detection controller 20, the power detector 16 holds the data Ds until the next data Ds is received from the power detection controller 20.

The power address decoder 21 uses the data Dr from the power detection controller 20, and generates address data indicating the address of the voltage data memory 22. In this process, in accordance with the data Dr, the power address decoder 21 selects one data table from the data tables stored in the voltage data memory 22, and outputs the address data stored in the data table to the voltage data memory 22. For example, when the data Dr is (7, 4, n), the power address decoder 21 selects one data table, which indicates the relationship between the reference voltages and the battery power sections when the battery temperature section is the seventh temperature section and the battery current section is the fourth current section, from the plural data tables, which indicate the relationship between the reference voltages and the battery power sections. Further, the power address decoder 21 sequentially outputs the address of the voltage data memory 22 where the reference voltage data corresponding to the limit power of the n-th power section in the table (that is, the n-th limit power) are stored.

The voltage data memory 22 sequentially outputs the reference voltage data stored at the addresses represented by the address data output from the power address decoder 21 to the reference voltage generation DAC 23. The reference voltage generation DAC 23 converts the digital data output from the voltage data memory 22 to analog data, and outputs the analog data to the voltage comparator 13 as reference voltages.

As a result, the reference voltage generation section 12 outputs reference voltages V1r through V11r corresponding to the limit powers of the power sections, sequentially. In the battery power detection device 10 of the present embodiment, the reference voltage generation section 12 generates and outputs the reference voltages in descending order.

As described above, the voltage comparator 13 compares the battery voltage output from the battery voltage detector 11 and the reference voltages sequentially output from the reference voltage generation section 12, and generates the two-level control signal Sr2 in response to the magnitude relationship between the battery voltage and the reference voltages. The voltage comparator 13 shown in FIG. 3 outputs the control signal Sr2 at the high level when the battery voltage is higher than one of the reference voltages, and outputs the control signal Sr2 at the low level when the battery voltage is lower than the one of the reference voltages.

Because the reference voltage generation section 12 generates and outputs the reference voltages in descending order, the control signal Sr2 is at the low level at the beginning; when the battery voltage becomes higher than the one reference voltage, the control signal Sr2 changes to the high level. In other words, it is deemed that the present battery power value is included in the power section corresponding to the reference voltage under comparison, which is performed when a change of the control signal Sr2 from the low level to the high level occurs, that is, when the control signal Sr2 is inverted. Note that, if the initial level of the control signal Sr2 is set to be low, even when the present battery power value is in the first power section, the power detector 16 is able to detect inversion of the level of the control signal Sr2.

The control signal Sr2 is input to the power detector 16. When the control signal Sr2 changes to the high level, the power detector 16 outputs the power section data held at this time to the battery power storage unit 17 and the output unit 18 as the data indicating the power section including the present battery power value.

The battery power storage unit 17 receives a control signal Sj2 output from the charging-discharging detector 19. The charging-discharging detector 19 receives a control signal Sj1 output from the power detection controller 20.

For example, when the control signal Sj1 is at the high level, the charging-discharging detector 19 starts operations to detect whether the battery is in charging or in discharging, and outputs the detection results as the control signal Sj2 to the battery power storage unit 17. For example, when the battery is in charging, the charging-discharging detector 19 outputs the control signal Sj2 at the high level, and when the battery is in discharging, the charging-discharging detector 19 outputs the control signal Sj2 at the low level. In this way, the charging or discharging condition of the battery is presented.

The configuration and operations of the charging-discharging detector 19 are described below.

In the period when the control signal Sj2 changes from the high level to the low level, that is, in the period when the battery is discharging, each time the power detector 16 outputs the power section data, among the power section data output from the power detector 16 in the period from the time when the battery starts to discharge to the time when the power section data are output, the battery power storage unit 17 outputs power section data, which indicates a power section including the minimum battery power value (below, referred to as "minimum power section" where necessary), to the output unit 18.

The output unit 18 compares the power section data output from the power detector 16 (referred to as "the first power section data") and the power section data output from the battery power storage unit 17 (referred to as "the second power section data"). When the battery power value included in the power section indicated by the first power section data is less than the battery power value included in the power section indicated by the second power section data, the output unit 18 outputs the first power section data to the outside as data Dp, which indicates the power section including the present battery power value. When the battery power value included in the power section indicated by the first power section data is greater than the battery power value included in the power section indicated by the second power section data, the output unit 18 outputs the second power section data to the outside as the data Dp.

In the period when the control signal Sj2 changes from the high level to the low level, and then changes to the high level again, that is, in the period when the battery starts to discharge again, the battery power storage unit 17 outputs power section data indicating a power section including the maximum battery power value (below, referred to as "maximum power section" where necessary).

In order to perform the above operations, the battery power storage unit 17 may include a first memory for storing the power section data output from the power detector 16 and a second memory for storing the power section data indicating the maximum power section. In this case, if the power section data output from the power detector 16 indicates a power section including a power value less than the power section data stored in the first memory, the battery power storage unit 17 rewrites the power section data stored in the first memory with the power section data output from the power detector 16.

After the control signal Sj2 changes from the high level to the low level, and immediately after the control signal Sj2 changes to the high level again, the battery power storage unit 17 outputs the power section data stored in the second memory.

For example, when the battery is not in use for a while and the battery voltage apparently rises, the battery power detection may erroneously indicate as if the battery voltage has become high. According to the battery power detection device 10 of the present embodiment, even when the battery is not in use for a while and the battery voltage apparently rises, it is possible to detect the correct battery power, and thus prevent the above erroneous detection. As a result, it is possible to display stable detection results of the power section including the above remaining power.

Note that the output unit 18 corresponds to the "power section output unit" in claims.

In the above, it is described that in the battery power detection device 10, the reference voltage generation section 12 generates and outputs the reference voltages in descending order, but the reference voltage generation section 12 may also generate and output the reference voltages in ascending order. In this case, the limit powers of the power sections are defined to be the upper limits thereof, and if the voltage comparator 13 is configured to output the high-level control signal Sr2 when the battery voltage is higher than one of the reference voltages, and outputs the low-level control signal Sr2 when the battery voltage is lower than the one of the reference voltages, when the control signal Sr2 changes to the high level, the power detector 16 outputs the power section data held at this time to the battery power storage unit 17 and the output unit 18 as the data indicating the power section including the present battery power value.

In the above battery power detection device 10 of the present embodiment, it is described that the battery voltage detector 11 measures the output voltage of the battery, and outputs the measured voltage value as the battery voltage data. Alternatively, a value in proportion to the measured voltage value may also be used as the battery voltage data. In this case, the reference voltage value output from the reference voltage generation section 12 changes according to the proportional coefficient.

In the above battery power detection device 10 of the present embodiment, the power address decoder 21 may be omitted. In this case, it is necessary to configure the power detection controller 20 so as to select one data table from the data tables stored in the voltage data memory 22 based on the temperature data Da and the current data Db, and output the address data indicating the address at which this data table is stored.

The control signal Sr2 generated by the voltage comparator 13 is output to the outside as a detection result indicating the fact that the present power value is detected. An external device inverts the control signal Dr1 and identifies the detection of the present power value, and uses the control signal Sr1 to stop comparison operations of the reference voltage generation section 12. The reference voltage generation section 12 is driven to operate only when the control signal Sr1 is at the high level, that is, only when it is necessary to detect the battery power or to drive other components; hence, it is possible to reduce power consumption of the battery power detection device 10.

Below, descriptions are made of configurations and operations of the temperature section detector 14, the current section detector 15, and the charging-discharging detector 19.

Figure 6:
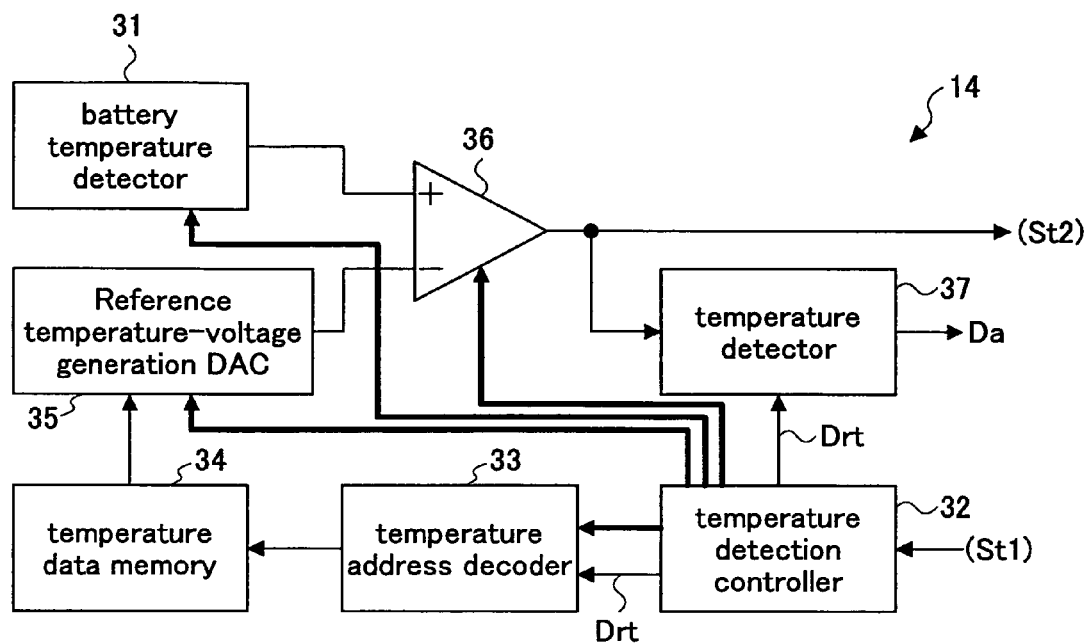
FIG. 6 is a block diagram exemplifying a configuration of the temperature section detector 14 according to the present embodiment.

FIG. 6 is a block diagram exemplifying a configuration of the temperature section detector 14 according to the present embodiment.

As illustrated in FIG. 6, the temperature section detector 14 includes a battery temperature detector 31, a temperature detection controller 32, a temperature address decoder 33, a temperature data memory 34, a reference temperature-voltage generation DAC 35, a temperature comparator 36, and a temperature detector 37.

The battery temperature detector 31, for example, a temperature sensor, is mounted near the battery to measure the temperature of the battery, converts the measured temperature into a voltage, and outputs the obtained voltage as a temperature-related voltage of the battery, the temperature-related voltage of the battery being proportional to the temperature of the battery.

The temperature comparator 36 is composed of an operational amplifier (Op-Amp); it compares the temperature-related voltage output from the battery temperature detector 31 and the reference temperature-related voltages output from the reference temperature-voltage generation DAC 35, and generates a two-level control signal St2 in response to the magnitude relationship between the temperature-related voltage and the reference temperature-related voltages.

In the temperature data memory 34, there is stored a data table including data indicating the reference temperature-related voltages corresponding to the respective temperature sections. Specifically, the temperature-related voltages are defined to be the voltages detected by the battery temperature detector 31 at the upper limit temperatures of the temperature sections in FIG. 4, that is, at −20° C., −10° C., 0° C., 10° C., 20° C., 30° C., 40° C., 50° C., 60° C., and 70° C., respectively.

A temperature control signal St1, which is output from the power detection controller 20 for controlling start and stop of temperature section detection operations, is input to the temperature detection controller 32. The temperature detection controller 32 starts or stops operations in response to the temperature control signal St1, and at the same time, the temperature detection controller 32 controls operations of the battery temperature detector 31, the temperature data memory 34, the reference temperature-voltage generation DAC 35, and the temperature comparator 36.

For example, a high-level temperature control signal St1 indicates start of the temperature section detection operation, that is, when receiving the temperature control signal St1 at the high level, the temperature detection controller 32 starts the operation of temperature section detection, and at the same time, outputs respective control signals to the other components, such as the battery temperature detector 31, the temperature data memory 34, the reference temperature-voltage generation DAC 35, and the temperature comparator 36 to control operations of these components.

When receiving the temperature control signal St1 at the high level, the temperature detection controller 32 outputs data Drt indicating the temperature sections to the temperature address decoder 33 and the temperature detector 37. In this process, the temperature detection controller 32 outputs data Drt indicating the temperature sections in ascending order of the temperatures included in the temperature sections.

The temperature detector 37 holds the data Drt output from the temperature detection controller 32 until the next data Drt is received from the temperature detection controller 32.

The temperature address decoder 33 uses the data Drt output from the temperature detection controller 32, generates address data indicating the address of the temperature data memory 34, at which address the reference temperature-related voltages corresponding to the temperature section indicated by the temperature section data Drt are stored.

The temperature data memory 34 sequentially outputs the voltage data stored at the addresses represented by the above address data to the reference temperature-voltage generation DAC 35. The reference temperature-voltage generation DAC 35 converts the digital data output from the temperature data memory 34 to analog data, and outputs the analog data to the temperature comparator 36 as reference temperature-related voltages.

As a result, the reference temperature-voltage generation DAC 35 sequentially outputs reference temperature-related voltages corresponding to the temperature sections in ascending order.

As described above, the temperature comparator 36 compares the temperature-related voltage output from the battery temperature detector 31 and the reference temperature-related voltages sequentially output from the reference temperature-voltage generation DAC 35, and generates the control signal St2 in response to the magnitude relationship between the temperature-related voltage and the reference temperature-related voltages.

The temperature comparator 36 shown in FIG. 6 outputs the control signal St2 at the high level when the temperature-related voltage is higher than one of the reference temperature-related voltages, and outputs the control signal St2 at the low level when the temperature-related voltage is lower than the one of the reference temperature-related voltages.

Because the reference temperature-voltage generation DAC 35 sequentially outputs reference temperature-related voltages in ascending order, the control signal St2 is at the high level at the beginning; when the temperature-related voltage becomes lower than the one reference temperature-related voltage output from the reference temperature-voltage generation DAC 35, the control signal St2 changes to the low level.

When the control signal St2 changes to the low level, the temperature detector 37 outputs the temperature section data held at this moment as the data Da indicating the temperature section including the battery temperature.

The control signal St2 generated by the temperature comparator 36 is output to the outside of the battery power detection device 10 as a detection result indicating the fact that the temperature of the battery is detected.

Note that, if the initial level of the control signal St2 is set to be high, even when the present battery temperature is in the first temperature section, the temperature detector 37 is able to detect inversion of the level of the control signal St2.

In the temperature section detector 14, the temperature detection controller 32 starts or stops operations in response to the temperature control signal St1 output from the power detection controller 20. At the same time, the temperature detection controller 32 controls operations of the other components of the temperature section detector 14, such as the battery temperature detector 31, the temperature data memory 34, the reference temperature-voltage generation DAC 35, and the temperature comparator 36. That is, the temperature section detector 14 is driven to operate only when it is required to detect the battery temperature or to drive other components; thus, it is possible to reduce power consumption in temperature detection, and in turn, it is possible to reduce power consumption of the battery power detection device 10.

In addition, according to the temperature section detector 14 described above, it is possible to easily and precisely detect the temperature section including the temperature of the battery under power detection.

Below, descriptions are made of configurations and operations of the current section detector 15.

Figure 7:
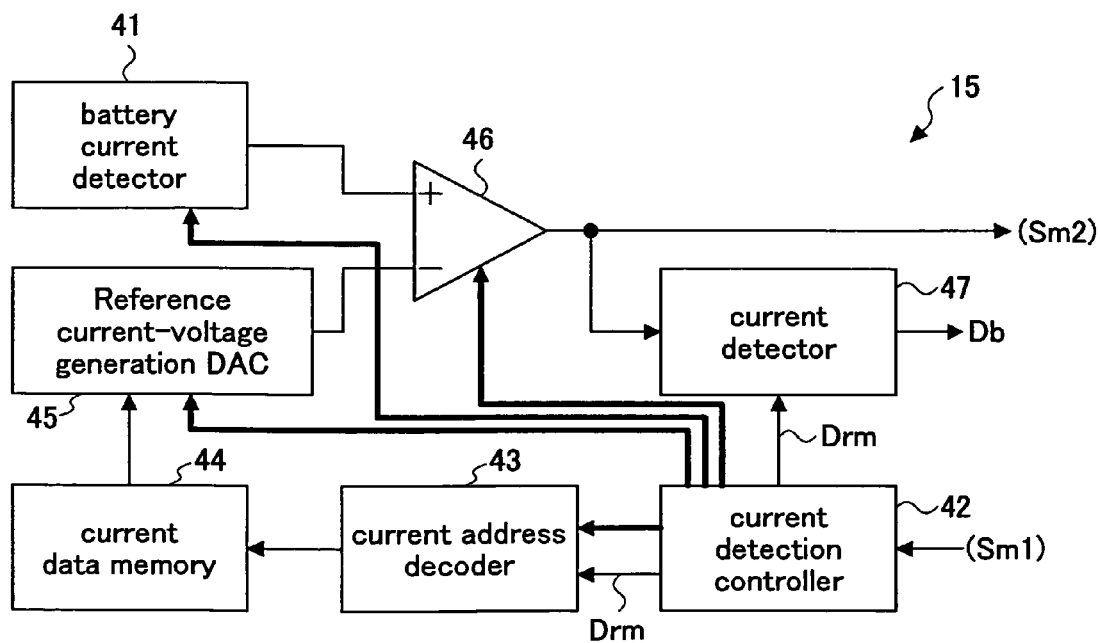
FIG. 7 is a block diagram exemplifying a configuration of the current section detector 15 according to the present embodiment.

FIG. 7 is a block diagram exemplifying a configuration of the current section detector 15 according to the present embodiment.

As illustrated in FIG. 7, the current section detector 15 includes a battery current detector 41, a current detection controller 42, a current address decoder 43, a current data memory 44, a reference current-voltage generation DAC 45, a current comparator 46, and a current detector 47.

The battery current detector 41 measures the current output from the battery for a time period, converts the average of the measured current into a voltage, and outputs the obtained voltage as a current-related voltage of the battery.

The current comparator 46 is composed of an operational amplifier (Op-Amp); it compares the current-related voltage output from the battery current detector 41 and the reference current-related voltages output from the reference current-voltage generation DAC 45, and generates a two-level control signal Sm2 in response to the magnitude relation between the current-related voltage and the reference current-related voltages.

In the current data memory 44, there is stored a data table including data indicating the reference current-related voltages corresponding to the respective current sections. Specifically, the current-related voltages are defined to be the voltages detected by the battery current detector 41 when the current from the battery equals the upper limit currents in the current sections in FIG. 5, that is, 20 mA, 40 mA, 60 mA, 80 mA, 100 mA, 120 mA, 140 mA, 160 mA, 180 mA, and 200 mA, respectively.

A current control signal Sm1, which is output from the power detection controller 20 for controlling start and stop of current section detection operations, is input to the current detection controller 42. The current detection controller 42 starts or stops operations in response to the current control signal Sm1; at the same time, the current detection controller 42 controls operations of the battery current detector 41, the current data memory 44, the reference current-voltage generation DAC 45, and the current comparator 46.

For example, a high-level current control signal Sm1 indicates start of the current section detection operation, that is, when receiving the current control signal Sm1 at the high level, the current detection controller 42 starts the operation of current section detection, and at the same time, outputs respective control signals to the other components, such as the battery current detector 41, the current data memory 44, the reference current-voltage generation DAC 45, and the current comparator 46 to control operations of these components.

When receiving the current control signal Sm1 at the high level, the current detection controller 42 outputs data Drm indicating the current sections to the current address decoder 43 and the current detector 47. In this process, the current detection controller 42 outputs data Drm in ascending order of the current included in the current sections.

The current detector 47 holds the data Drm output from the current detection controller 42 until the next data Drm is received from the current detection controller 42.

The current address decoder 43 uses the data Drm output from the current detection controller 42, generates address data indicating the address of the current data memory 44, at which address the reference current-related voltages corresponding to the current section indicated by the temperature section data Drm are stored.

The current data memory 44 sequentially outputs the voltage data stored at the addresses represented by the above address data to the reference current-voltage generation DAC 45. The reference current-voltage generation DAC 45 converts the digital data output from the current data memory 44 to analog data, and outputs the analog data to the current comparator 46 as reference current-related voltages.

Because the voltage related to the battery current is proportional to the battery current, the reference current-voltage generation DAC 45 sequentially outputs reference current-related voltages corresponding to the current sections in ascending order.

As described above, the current comparator 46 compares the current-related voltage output from the battery current detector 41 and the reference current-related voltages sequentially output from the reference current-voltage generation DAC 45, and generates the control signal Sm2 in response to the magnitude relation between the current-related voltage and the reference current-related voltages.

The current comparator 46 shown in FIG. 7 outputs the control signal Sm2 at the high level when the current-related voltage is higher than one of the reference current-related voltages, and outputs the control signal Sm2 at the low level when the current-related voltage is lower than the one of the reference current-related voltages.

Because the reference current-voltage generation DAC 45 sequentially outputs reference current-related voltages in ascending order, the control signal Sm2 is at the high level at the beginning; when the current-related voltage becomes lower than the one reference current-related voltage output from the reference current-voltage generation DAC 45, the control signal Sm2 changes to the low level.

When the control signal Sm2 changes to the low level, the current detector 47 outputs the current section data held at this moment as the data Db indicating the current section including the battery current.

The control signal Sm2 generated by the current comparator 46 is output to the outside of the battery power detection device 10 as a detection result indicating the fact that the current of the battery is detected.

In the current section detector 15, the current detection controller 42 starts or stops operations in response to the current control signal Sm1 output from the power detection controller 20. At the same time, the current detection controller 42 controls operations of the other components of the current section detector 15, such as the battery current detector 41, the current data memory 44, the reference current-voltage generation DAC 45, and the current comparator 46. That is, the current section detector 15 is driven to operate only when it is required to detect the battery current or to drive other components, thus, it is possible to reduce power consumption in current detection, in turn, it is possible to reduce power consumption of the battery power detection device 10.

In addition, according to the current section detector 15 described above, it is possible to easily and precisely detect the current section including the current of the battery under power detection.

Below, descriptions are made of configurations and operations of the charging-discharging detector 19.

Figure 8:
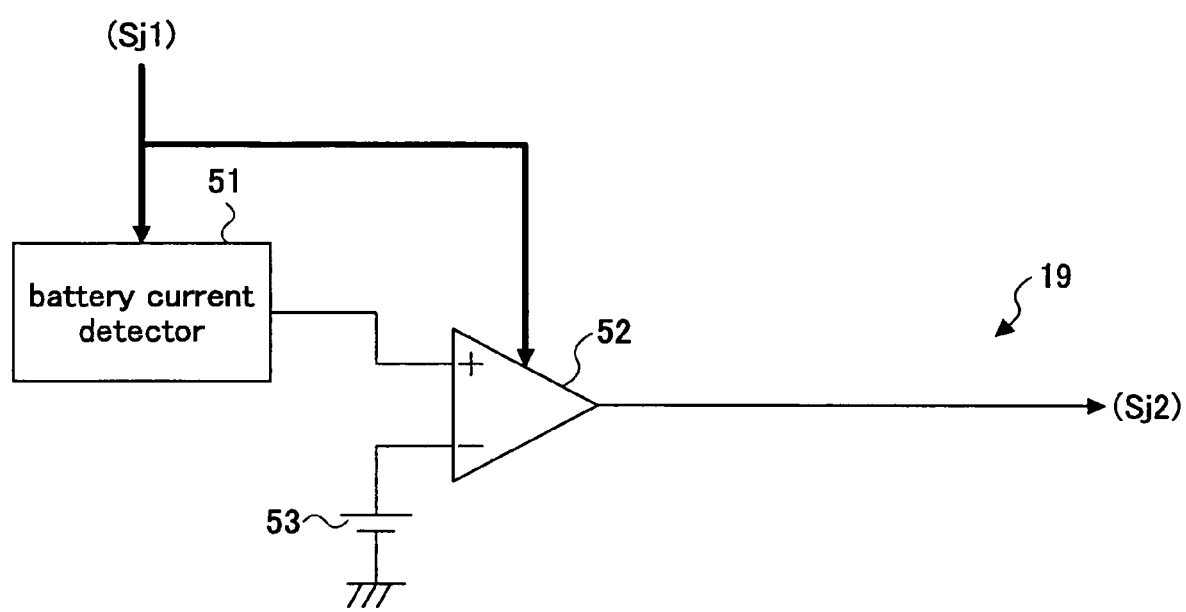
FIG. 8 is a block diagram exemplifying a configuration of the charging-discharging detector 19 according to the present embodiment.

FIG. 8 is a block diagram exemplifying a configuration of the charging-discharging detector 19 according to the present embodiment.

As illustrated in FIG. 8, the charging-discharging detector 19 includes a battery current detector 51, a charging number comparator 52, and a polarity reference voltage generator 53.

The battery current detector 51 measures the current output from the battery for a time period, converts the average of the measured currents into a voltage, and outputs the obtained voltage as a current-related voltage of the battery. The battery current detector 51 outputs a negative voltage when the battery current flows in a direction to charge the battery, and outputs a positive voltage when the battery current flows in a direction to discharge the battery.

The polarity reference voltage generator 53 generates a charging reference voltage for identifying whether the battery current is in a direction of charging the battery.

The charging number comparator 52 compares the current-related voltage output from the battery current detector 51 and the charging reference voltage output from the polarity reference voltage generator 53, and generates a two-level control signal Sj2 in response to the magnitude relation between the current-related voltage and the charging reference voltage. For example, the charging number comparator 52 outputs the control signal Sj2 at the high level when the current-related voltage is higher than the charging reference voltage, and outputs the control signal Sj2 at the low level when the current-related voltage is lower than the charging reference voltage. Because the current-related voltage is proportional to the average current obtained by measuring the current output from the battery for a time period, when the battery is discharging, the current-related voltage becomes higher than the charging reference voltage.

The control signal Sj2 output from the charging number comparator 52 is input to the battery power storage unit 17.

The battery current detector 51 starts or stops operations in response to the control signal Sj1 output from the power detection controller 20. The charging number comparator 52 starts or stops operations in response to the control signal Sj1 output from the power detection controller 20.

In the above, it is described that different battery current detectors 41, 51 are used in the current section detector 15 and the charging-discharging detector 19, respectively, but the current section detector 15 and the charging-discharging detector 19 may use the same battery current detector. When using the same battery current detector, it is possible to reduce the size of the battery power detection device 10.

In the above, it is described that the full power range of the battery is divided into eleven sections, the operating temperature range of the battery is divided into ten sections, and the full range of the output current of the battery is divided into ten sections; it is certain that the number of sections is not limited to these examples, but the number of sections may be any value. Further, the number of sections may be different from each other, equal to each other, or be partially equal to each other.

In addition, the width of each of the power sections may be any value. Because the dependence of the relation between the output voltage of the battery and the battery power on the temperature of the battery and the load current of the battery is weak when the remaining power of the battery is high, and the dependence is strong when the remaining power of the battery is low, preferably, the width of the power section is set to be large when the remaining power of the battery is high, and the width of the power section is set to be small when the remaining power of the battery is low. Because it is not necessary to hurry up to charge the battery when the remaining power of the battery is high, even when the division of the power is rough when the remaining power of the battery is high, there is not any problem.

In the battery power detection device 10 according to the present embodiment, because the battery remaining power is determined by just detecting the battery voltage and comparing the battery voltage with the internal reference voltages generated in advance, detection of the battery power becomes easy.

In addition, in the battery power detection device 10 of the present embodiment, the power section including the present battery power value is detected from the detected battery voltage, while considering the temperature section including the present battery temperature and the current section including the present output current of the battery. Therefore, in the battery power detection device 10 of the present embodiment, the number of one-dimensional data tables each representing the relationship between the battery voltage and the battery power equals a product of the number of the battery temperature sections obtained by dividing the operation temperature range and the number of the battery current sections obtained by dividing the full range of the output current of the battery.

That is, the number of voltage data stored in the battery power detection device 10 equals the product of the number of the battery temperature sections, the number of the battery current sections and the number of the battery power sections. Due to this, by appropriately selecting the number of the battery temperature sections, the number of the battery current sections and the number of the battery power sections, it is possible to greatly reduce the number of voltage data items stored in the battery power detection device 10 compared to the number of voltage data items stored in a battery power detection device of the related art.

Therefore, it is possible to greatly reduce the capacity of the memory in the battery power detection device 10 compared to the battery power detection device of the related art, in which a large number of two dimensional data tables each representing the relationship between the battery voltage and the battery current are stored in correspondence to each of the battery temperatures.

Because it is not necessary to carry a large number of two-dimensional data tables each representing the relation between the battery voltage and the battery current corresponding each of the battery temperatures, respectively, as required in the related art, it is possible to reduce the capacity of the memory greatly. In addition, in the battery power detection device 10 of the present embodiment, reference voltages are generated while being associated with the battery temperature and the current of the battery; therefore it is possible to achieve sufficiently high detection accuracy compared to the related art.

Thus, the present embodiment is able to provide a battery power detection device that has a reduced circuit area and is able to achieve sufficiently high detection accuracy.

Second Embodiment

Below, a battery power detection device according to a second embodiment of the present invention is explained.

In the battery power detection device of the present embodiment, in addition to the temperature section including the present temperature of the battery and a current section including the present output current of the battery, the number of times of charging the battery is also considered when generating the reference voltages.

For example, assume the temperature of the battery is 25° C., the current of the battery is 0 A, and the number of times of charging the battery is zero; the battery voltage under these conditions corresponds to the n-th power section, the reference voltage corresponds to the n-th power section is Vn, and a correction voltage related to the number of times of charging is $\Delta Vnk$. This correction voltage $\Delta Vnk$ can be calculated from a product of the number of times of charging and a degradation coefficient of the battery voltage in the n-th power section. Because the battery voltage decreases when the number of times of charging increases, the comparison voltage Vnr at each limit power can be expressed by the following formula (2).

$$Vnr = Vn + \Delta Vnt - \Delta Vni - \Delta Vnk \quad (2)$$

By using formula (2), in the battery power detection device of the present embodiment, it is possible to correctly detect the battery power even when the relationship between the output voltage of the battery and the battery power level changes due to the number of times of charging the battery.

Figure 9:
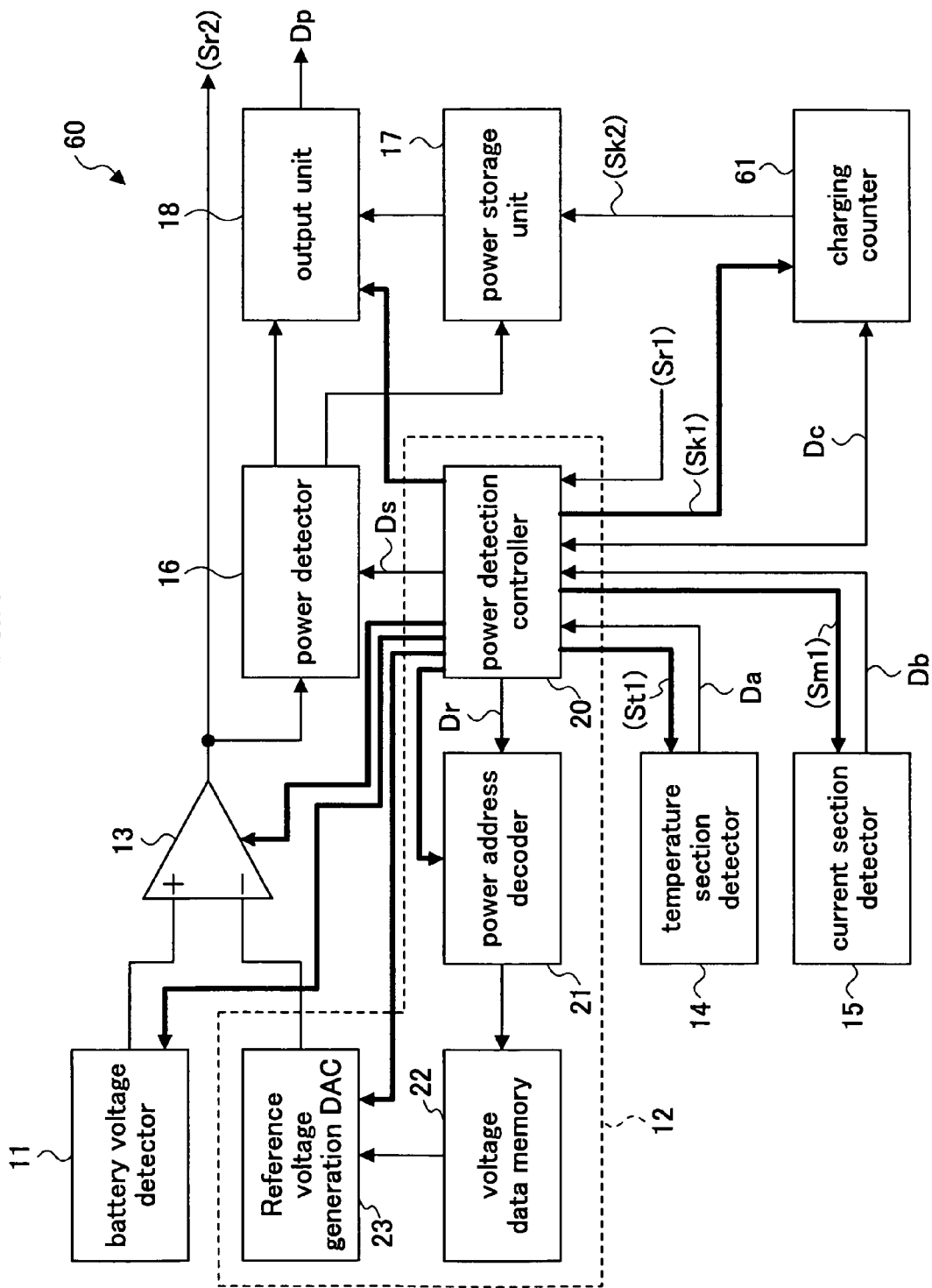
FIG. 9 is a block diagram exemplifying a configuration of a battery power detection device according to the present embodiment.

FIG. 9 is a block diagram exemplifying a configuration of a battery power detection device according to the present embodiment.

In FIG. 9, the same reference numbers are assigned to the same elements as those described in the previous embodiment, and overlapping descriptions are omitted appropriately.

As illustrated in FIG. 9, a battery power detection device 60 of the present embodiment includes a battery voltage detector 11, a reference voltage generation section 12, a voltage comparator 13, a temperature section detector 14, a current section detector 15, a power detector 16, a battery power storage unit 17, an output unit 18, a charging-discharging detector 19, and a charging counter 61.

The charging counter 61 detects the output current of the battery, determines whether the battery is being charged from the output current, stores the number of times of charging operations, and outputs charging number data Dc indicating the number of times of charging operations. In addition, the charging counter 61 starts or stops operations according to a control signal Sk1 input from the power detection controller 20 in response to the external control signal Sr1.

Figure 10:
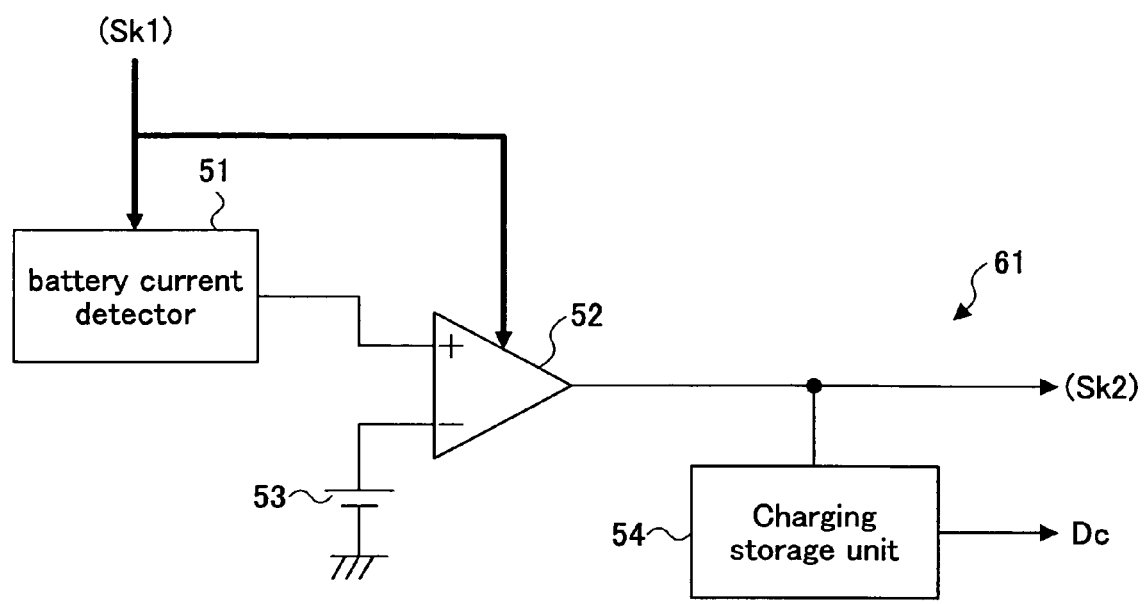
FIG. 10 is a block diagram exemplifying a configuration of the charging counter 61 according to the present embodiment.

FIG. 10 is a block diagram exemplifying a configuration of the charging counter 61 according to the present embodiment.

In FIG. 10, the same reference numbers are assigned to the same elements as those described in FIG. 8, and overlapping descriptions are omitted appropriately.

As illustrated in FIG. 10, the charging counter 61 includes a battery current detector 51, a charging number comparator 52, a polarity reference voltage generator 53, and a charging storage unit 54.

As described above, the charging number comparator 52 compares the current-related voltage output from the battery current detector 51 and the charging reference voltage output from the polarity reference voltage generator 53, and generates a two-level control signal Sk2 in response to the magnitude relationship between the current-related voltage and the charging reference voltage. For example, the charging number comparator 52 outputs the control signal Sk2 at the high level when the current-related voltage is higher than the charging reference voltage, and outputs the control signal Sk2 at the low level when the current-related voltage is lower than the charging reference voltage.

The charging storage unit 54 counts the inversions of the output signal from the charging number comparator 52, that is, counts the variations of the control signal Sk2 from the high level to the low level, stores the count, and at the same time, outputs the count as the charging number data Dc.

As described above, the charging counter 61 starts or stops operations in response to the control signal Sk1 output from the power detection controller 20. Specifically, the battery current detector 51 starts or stops operations in response to the control signal Sk1 output from the power detection controller 20, and the charging number comparator 52 starts or stops operations in response to the control signal Sk1 output from the power detection controller 20.

In the voltage data memory 22, there stored plural data tables each including data indicating reference voltages corresponding to the respective limit powers for each combination of the battery temperature section, the battery current section, and the charging number. Specifically, as illustrated in FIG. 4 and FIG. 5, there are ten battery temperature sections and ten battery current sections, if the possible number of times of charging the battery is 500, there are 10×10×500=5000 data tables stored in the voltage data memory 22.

The charging counter 61 detects whether the battery is in charging or in discharging, and outputs the detection results as the control signal Sk2 to the battery power storage unit 17.

When the control signal Sk2 changes from the high level to the low level, and changes to the high level again, that is, when the battery starts to discharge again, the battery power storage unit 17 outputs power section data indicating a maximum power section including the maximum battery power value.

In this way, because the reference voltages are generated while taking into consideration the number of times of charging the battery, even when the battery has been used repeatedly for many times, it is possible to correctly detect the battery power by reflecting the degradation of the battery after the repeated use.

According to the present embodiment, in addition to the effects obtainable by the first embodiment, because it is not necessary to carry a large number of two-dimensional data tables each representing the relationship between the battery voltage and the battery current, as required in the related art, it is possible to reduce the capacity of the memory greatly.

Further, in the battery power detection device of the present embodiment, because the number of times of charging the battery is considered when generating the reference voltages, in addition to the temperature section including the present temperature of the battery and a current section including the present output current of the battery, it is possible to achieve sufficiently high detection accuracy compared to the related art.

While the present invention is described above with reference to specific embodiments chosen for purpose of illustration, it should be apparent that the invention is not limited to these embodiments, but numerous modifications could be made thereto by those skilled in the art without departing from the basic concept and scope of the invention.

This patent application is based on Japanese Priority Patent Application No. 2004-333283 filed on Nov. 17, 2004, the entire contents of which are hereby incorporated by reference.

What is claimed is:

1. A battery power detection device for detecting a remaining power of a battery, comprising:
    a temperature section detection unit that detects a temperature of the battery and detects one of a plurality of predetermined temperature sections including the detected temperature;
    a current section detection unit that detects a current output from the battery and detects one of a plurality of predetermined current sections including the detected current; and
    a power section detection unit that has a plurality of one-dimensional voltage-power data tables each including data indicating a relationship between a voltage output from the battery and a plurality of predetermined remaining power sections of the battery, said power section detection unit selecting one of the voltage-power data tables according to the detected temperature section and the detected current section, and detecting, with the selected voltage-power data table, one of the remaining power sections associated with a predetermined voltage of the battery.

2. The battery power detection device as claimed in claim 1, further comprising a charging number detection unit that detects a number of times of charging the battery;
    wherein the power section detection unit selects one of the voltage-power data tables according to the detected temperature section, the detected current section, and the detected number of times of charging.

3. The battery power detection device as claimed in claim 2, wherein the power section detection unit starts or stops operations in response to an external control signal input from outside, and controls operations of the temperature section detection unit, the current section detection unit, and the charging number detection unit.

4. The battery power detection device as claimed in claim 3, wherein
    the voltage-power data tables include data indicating limits of each of the remaining power sections and voltage values corresponding to said limits, said limits including at least one of an upper limit and a lower limit of each of the remaining power sections;
    the power section detection unit includes:
    a reference voltage generator that has the plural voltage-power data tables, said reference voltage generator selecting one of the voltage-power data tables according to the detected temperature section, the detected current section, and the detected number of times of charging, and sequentially outputting the voltage values corresponding to said limits indicated by the selected voltage-power data table as reference voltages;
    a voltage comparator that compares the predetermined voltage of the battery to the reference voltages, and outputs a first control signal corresponding to the comparison result; and
    a power detector that, when the first control signal is generated, outputs one of the predetermined remaining power sections indicated by the reference voltage as the remaining power section associated with the predetermined voltage of the battery;
    the temperature section detection unit includes:
    a first temperature detector that detects the temperature of the battery, and outputs a temperature-related voltage proportional to the detected temperature; and
    a second temperature detector that has a temperature-voltage data table including data indicating a relationship between the temperature of the battery and the temperature-related voltage, said second temperature detector detecting one of the temperature sections including the detected temperature with the temperature-voltage data table and the detected temperature-related voltage, and outputting the detected temperature section;
    the temperature-voltage data table includes data indicating limits of each of the temperature sections and temperature-related voltage values corresponding to said limits, said limits including at least one of an upper limit and a lower limit of each of the temperature sections;
    the second temperature detector includes:
    a reference temperature-related voltage generator that has the temperature-voltage data table, and outputs sequentially the temperature-related voltage values corresponding to said limits indicated by the temperature-voltage data table as reference temperature-related voltages;
    a temperature-related voltage comparator that compares the detected temperature-related voltage to the reference temperature-related voltages, and outputs a second control signal corresponding to the comparison result; and
    a third temperature detector that, when the second control signal is generated, outputs one of the temperature sections corresponding to the reference temperature-related voltage as the temperature section associated with the detected temperature;
    the current section detection unit includes:

a first current detector that detects the current output from the battery, and outputs a current-related voltage proportional to the detected current; and a second current detector that has a current-voltage data table including data indicating a relation between the current output from the battery and the current-related voltage, said second current detector detecting one of the current sections including the detected current with the current-voltage data table and the detected current-related voltage, and outputting the detected current section;

the current-voltage data table includes data indicating limits of each of the current sections and current-related voltage values corresponding to said limits, said limits including at least one of an upper limit and a lower limit of each of the current sections;

the second current detector includes:

a reference current-related voltage generator that has the current-voltage data table, and outputs sequentially the current-related voltage values corresponding to said limits indicated by the current-voltage data table as reference current-related voltages;

a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current;

the reference voltage generator starts or stops operations in response to the external control signal, controls operations of the voltage comparator, and outputs a fourth control signal to the temperature section detection unit, a fifth control signal to the current section detection unit, and a sixth control signal to the charging number detection unit;

the reference temperature-related voltage generator starts or stops operations in response to the fourth control signal, and controls operations of the temperature-related voltage comparator and the first temperature detector; and the reference current-related voltage generator starts or stops operations in response to the fifth control signal, and controls operations of the current-related voltage comparator and the first current detector.

5. The battery power detection device as claimed in claim 3, wherein the charging number detection unit detects whether the battery is charging or discharging, and outputs a 10th control signal corresponding to a detection result, said battery power detection device further comprising:

a power storage unit that receives the remaining power section detected by the power section detection unit and the 10th control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

6. The battery power detection device as claimed in claim 5, wherein the power section detection unit controls operations of the power section output unit in response to the external control signal.

7. The battery power detection device as claimed in claim 3, wherein the charging number detection unit includes:

a current detector that detects the current output from the battery, and outputs a current-related voltage proportional to the detected current;

a charging comparator that compares the current-related voltage to a predetermined reference voltage, and outputs the 10th control signal when the reference voltage is higher than the current-related voltage; and a counter that counts a number of the ninth control signal output from the charging comparator, and outputs the count of the ninth control signal as the number of charging the battery.

8. The battery power detection device as claimed in claim 7, further comprising:

a power storage unit that receives the remaining power section detected by the power section detection unit and the 10th control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

9. The battery power detection device as claimed in claim 8, wherein the power section detection unit controls operations of the power section output unit in response to the external control signal.

10. The battery power detection device as claimed in claim 2, wherein the voltage-power data tables include data indicating limits of each of the remaining power sections and voltage values corresponding to said limits, said limits including at least one of an upper limit and a lower limit of each of the remaining power sections, and the power section detection unit includes:

a reference voltage generator that has the plural voltage-power data tables, said reference voltage generator selecting one of the voltage-power data tables according to the detected temperature section, the detected current section, and the detected number of times of charging, and sequentially outputting the voltage values corresponding to said limits indicated by the selected voltage-power data table as reference voltages;

a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery.

11. The battery power detection device as claimed in claim 10, wherein the reference voltage generator includes:

a storage unit that stores the voltage-power data tables;

a selection unit that selects one of the voltage-power data tables according to the detected temperature section and the detected current section; and an output unit that sequentially outputs the voltage values corresponding to said limits indicated by the selected voltage-power data table as reference voltages.

12. The battery power detection device as claimed in claim 2, wherein the temperature section detection unit includes:

a first temperature detector that detects the temperature of the battery, and outputs a temperature-related voltage proportional to the detected temperature; and a second temperature detector that has a temperature-voltage data table including data indicating a relationship between the temperature of the battery and the temperature-related voltage, said second temperature detector detecting one of the temperature sections including the detected temperature with the temperature-voltage data table and the detected temperature-related voltage, and outputting the detected temperature section.

13. The battery power detection device as claimed in claim 12, wherein the temperature-voltage data table includes data indicating limits of each of the temperature sections and temperature-related voltage values corresponding to said limits, said limits including at least one of an upper limit and a lower limit of each of the temperature sections; and the second temperature detector includes:

a reference temperature-related voltage generator that has the temperature-voltage data table, and outputs sequentially the temperature-related voltage values corresponding to said limits indicated by the temperature-voltage data table as reference temperature-related voltages;

a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature.

14. The battery power detection device as claimed in claim 2, wherein the current section detection unit includes:

a first current detector that detects the current output from the battery, and outputs a current-related voltage proportional to the detected current; and a second current detector that has a current-voltage data table including data indicating a relationship between the current output from the battery and the current-related voltage, said second current detector detecting one of the current sections including the detected current with the current-voltage data table and the detected current-related voltage, and outputting the detected current section.

15. The battery power detection device as claimed in claim 14, wherein the current-voltage data table includes data indicating limits of each of the current sections and current-related voltage values corresponding to said limits, said limits including at least one of an upper limit and a lower limit of each of the current sections; and the second current detector includes:

a reference current-related voltage generator that has the current-voltage data table, and outputs sequentially the current-related voltage values corresponding to said limits indicated by the current-voltage data table as reference current-related voltages;

a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current.

16. The battery power detection device as claimed in claim 2, wherein the charging number detection unit detects whether the battery is being charged or being discharged, and outputs a ninth control signal corresponding to a detection result, said battery power detection device further comprising:

a power storage unit that receives the remaining power section detected by the power section detection unit and the ninth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

17. The battery power detection device as claimed in claim 2, wherein the charging number detection unit includes:

a current detector that detects the current output from the battery, and outputs a current-related voltage proportional to the detected current;

a charging comparator that compares the current-related voltage to a predetermined reference voltage, and outputs the ninth control signal when the reference voltage is higher than the current-related voltage; and a counter that counts a number of the ninth control signal output from the charging comparator, and outputs the count of the ninth control signal as the number of charging the battery.

18. The battery power detection device as claimed in claim 17, further comprising:

a power storage unit that receives the remaining power section detected by the power section detection unit and the ninth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

19. The battery power detection device as claimed in claim 1, wherein the power section detection unit starts or stops operations in response to an external control signal input from outside, and controls operations of the temperature section detection unit and the current section detection unit.

20. The battery power detection device as claimed in claim 19, wherein the voltage-power data tables include data indicating limits of each of the remaining power sections and voltage values corresponding to said limits, said limits including at least one of an upper limit and a lower limit of each of the remaining power sections;

the power section detection unit includes:

a reference voltage generator that has the plural voltage-power data tables, said reference voltage generator selecting one of the voltage-power data tables according to the detected temperature section and the detected current section, and sequentially outputting the voltage values corresponding to said limits indicated by the selected voltage-power data table as reference voltages;

a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery;

the temperature section detection unit includes:

a first temperature detector that detects the temperature of the battery, and outputs a temperature-related voltage proportional to the detected temperature; and a second temperature detector that has a temperature-voltage data table including data indicating a relationship between the temperature of the battery and the temperature-related voltage, said second temperature detector detecting one of the temperature sections including the detected temperature, the temperature-voltage data table, and the detected temperature-related voltage, and outputting the detected temperature section;

the temperature-voltage data table includes data indicating limits of each of the temperature sections and temperature-related voltage values corresponding to said limits, said limits including at least one of an upper limit and a lower limit of each of the temperature sections;

the second temperature detector includes:

a reference temperature-related voltage generator that has the temperature-voltage data table, and outputs sequentially the temperature-related voltage values corresponding to said limits indicated by the temperature-voltage data table as reference temperature-related voltages;

a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature;

the current section detection unit includes:

a first current detector that detects the current output from the battery, and outputs a current-related voltage proportional to the detected current; and a second current detector that has a current-voltage data table including data indicating a relation between the current output from the battery and the current-related voltage, said second current detector detecting one of the current sections including the detected current with the current-voltage data table and the detected current-related voltage, and outputting the detected current section;

the current-voltage data table includes data indicating limits of each of the current sections and current-related voltage values corresponding to said limits, said limits including at least one of an upper limit and a lower limit of each of the current sections;

the second current detector includes:

a reference current-related voltage generator that has the current-voltage data table, and outputs sequentially the current-related voltage values corresponding to said limits indicated by the current-voltage data table as reference current-related voltages;

a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current;

the reference voltage generator starts or stops operations in response to the external control signal, controls operations of the voltage comparator, and outputs a fourth control signal to the temperature section detection unit and a fifth control signal to the current section detection unit;

the reference temperature-related voltage generator starts or stops operations in response to the fourth control signal, and controls operations of the temperature-related voltage comparator and the first temperature detector; and the reference current-related voltage generator starts or stops operations in response to the fifth control signal, and controls operations of the current-related voltage comparator and the first current detector.

21. The battery power detection device as claimed in claim 19, further comprising:

a charging-discharging detection unit that detects whether the battery is charging or discharging, and outputs an eighth control signal corresponding to a detection result;

a power storage unit that receives the remaining power section detected by the power section detection unit and the eighth control signal, and stores a minimum power section including a minimum power among the remaining power sections output from the power section detection unit in a time period from a time when the battery starts to discharge to a time when the battery starts to be charged; and a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

22. The battery power detection device as claimed in claim 21, wherein the power section detection unit controls operations of the charging-discharging detection unit and the power section output unit in response to the external control signal.

23. The battery power detection device as claimed in claim 1, wherein the voltage-power data tables include data indicating limits of each of the remaining power sections and voltage values corresponding to said limits, said limits including at least one of an upper limit and a lower limit of each of the remaining power sections, and the power section detection unit includes:

a reference voltage generator that has the plural voltage-power data tables, said reference voltage generator selecting one of the voltage-power data tables according to the detected temperature section and the detected current section, and sequentially outputting the voltage values corresponding to said limits indicated by the selected voltage-power data table as reference voltages;

a voltage comparator that compares the predetermined voltage of the battery to the reference voltages, and outputs a first control signal corresponding to the comparison result; and a power detector that, when the first control signal is generated, outputs one of the predetermined remaining power sections indicated by the reference voltage as the remaining power section associated with the predetermined voltage of the battery.

24. The battery power detection device as claimed in claim 23, wherein the reference voltage generator includes:

a storage unit that stores the voltage-power data tables;

a selection unit that selects one of the voltage-power data tables according to the detected temperature section and the detected current section; and an output unit that sequentially outputs the voltage values corresponding to said limits indicated by the selected voltage-power data table as reference voltages.

25. The battery power detection device as claimed in claim 1, wherein the temperature section detection unit includes:

a first temperature detector that detects the temperature of the battery, and outputs a temperature-related voltage proportional to the detected temperature; and a second temperature detector that has a temperature-voltage data table including data indicating a relationship between the temperature of the battery and the temperature-related voltage, said second temperature detector detecting one of the temperature sections including the detected temperature with the temperature-voltage data table and the detected temperature-related voltage, and outputting the detected temperature section.

26. The battery power detection device as claimed in claim 25, wherein the temperature-voltage data table includes data indicating limits of each of the temperature sections and temperature-related voltage values corresponding to said limits, said limits including at least one of an upper limit and a lower limit of each of the temperature sections, and the second temperature detector includes:

a reference temperature-related voltage generator that has the temperature-voltage data table, and outputs sequentially the temperature-related voltage values corresponding to said limits indicated by the temperature-voltage data table as reference temperature-related voltages;

a temperature-related voltage comparator that compares the detected temperature-related voltage to the reference temperature-related voltages, and outputs a second control signal corresponding to the comparison result; and a third temperature detector that, when the second control signal is generated, outputs one of the temperature sections corresponding to the reference temperature-related voltage as the temperature section associated with the detected temperature.

27. The battery power detection device as claimed in claim 1, wherein the current section detection unit includes:

a first current detector that detects the current output from the battery, and outputs a current-related voltage proportional to the detected current; and a second current detector that has a current-voltage data table including data indicating a relationship between the current output from the battery and the current-related voltage, said second current detector detecting one of the current sections including the detected current with the current-voltage data table and the detected current-related voltage, and outputting the detected current section.

28. The battery power detection device as claimed in claim 27, wherein the current-voltage data table includes data indicating limits of each of the current sections and current-related voltage values corresponding to said limits, said limits including at least one of an upper limit and a lower limit of each of the current sections, and the second current detector includes:

a reference current-related voltage generator that has the current-voltage data table, and outputs sequentially the current-related voltage values corresponding to said limits indicated by the current-voltage data table as reference current-related voltages;

a current-related voltage comparator that compares the detected current-related voltage to the reference current-related voltages, and outputs a third control signal corresponding to the comparison result; and a third current detector that, when the third control signal is generated, outputs one of the current sections corresponding to the reference current-related voltages as the current section associated with the detected current.

29. The battery power detection device as claimed in claim 1, further comprising:

a charging-discharging detection unit that detects whether the battery is charging or discharging, and outputs a seventh control signal corresponding to a detection result;

a power storage unit that receives the remaining power section detected by the power section detection unit and the seventh control signal, and stores a minimum power section including a minimum power among the remaining power sections output from the power section detection unit in a time period from a time when the battery starts to discharge to a time when the battery starts to be charged; and
a power section output unit that compares the remaining power section detected by the power section detection unit and the minimum power section, selects a section including a lower power, and outputs the section;

wherein when the remaining power sections are output from the power section detection unit, the power storage unit outputs the minimum power section including a minimum power among the remaining power sections output from the power section detection unit in a time period from a time when the battery starts to discharge to a time when the remaining power sections are output.

* * * * *

UNITED STATES PATENT AND TRADEMARK OFFICE
CERTIFICATE OF CORRECTION

PATENT NO.        : 7,624,292 B2
APPLICATION NO.   : 11/274267
DATED             : November 24, 2009
INVENTOR(S)       : Junji Nishida It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 948 days.

Signed and Sealed this

Twenty-sixth Day of October, 2010

David J. Kappos
*Director of the United States Patent and Trademark Office*